(12) United States Patent
Hsu et al.

(10) Patent No.: US 7,667,566 B2
(45) Date of Patent: Feb. 23, 2010

(54) INDUCTOR STRUCTURE

(75) Inventors: Tsun-Lai Hsu, Hsin-Chu Hsien (TW);
Jui-Fang Chen, Miao-Li Hsien (TW);
Jun-Hong Ou, Taipei (TW)

(73) Assignee: United Microelectronics Corp.,
Hsin-Chu (TW)

( * ) Notice: Subject to any disclaimer, the term of this patent is extended or adjusted under 35 U.S.C. 154(b) by 0 days.

(21) Appl. No.: 12/196,294

(22) Filed: Aug. 22, 2008

(65) Prior Publication Data
US 2008/0303623 A1 Dec. 11, 2008

Related U.S. Application Data

(62) Division of application No. 11/278,550, filed on Apr. 4, 2006, now Pat. No. 7,498,918.

(51) Int. Cl.
*H01F 5/00* (2006.01)
(52) U.S. Cl. ...................................... 336/200
(58) Field of Classification Search ................. 336/65, 336/83, 170, 200, 214–215, 232; 257/531
See application file for complete search history.

(56) References Cited

U.S. PATENT DOCUMENTS

| 5,572,179 | A | * | 11/1996 | Ito et al. | ............ 336/200 |
| 6,037,649 | A |   | 3/2000  | Liou      |                    |
| 6,417,754 | B1|   | 7/2002  | Bernhardt |                    |
| 6,791,447 | B2|   | 9/2004  | Scheible  |                    |
| 6,859,129 | B2|   | 2/2005  | Tsai      |                    |
| 7,023,316 | B2|   | 4/2006  | Ahn       |                    |
| 7,030,725 | B2|   | 4/2006  | Ahn       |                    |
| 7,321,285 | B2| * | 1/2008  | Hung et al. | ............ 336/200 |
| 7,411,479 | B2| * | 8/2008  | Baarman et al. | ......... 336/198 |
| 2004/0127036 | A1 | | 7/2004 | Ahn |                    |

FOREIGN PATENT DOCUMENTS

WO 02/080279 10/2002

* cited by examiner

*Primary Examiner*—Tuyen Nguyen
(74) *Attorney, Agent, or Firm*—Winston Hsu

(57) ABSTRACT

An inductor structure comprising a substrate; a plurality of insulation layers on the substrate; a first spiral electric conductive coil positioned in the insulation layers to form an inductor having a first direction of magnetic field; a second spiral electric conductive coil positioned in the insulation layers to form an inductor having a second direction of magnetic field, in which, the two or more inductors are independently positioned in a same 3-D space and have a good integration.

8 Claims, 15 Drawing Sheets

INDUCTOR STRUCTURE

CROSS REFERENCE TO RELATED APPLICATIONS

This application is a division of applicants' earlier application Ser. No. 11/278,550, filed Apr. 4, 2006, which is included herein by reference.

BACKGROUND OF THE INVENTION

1. Field of the Invention

The present invention relates to an inductor, and more particularly, to an inductor structure made with integrated circuit technology.

2. Description of the Prior Art

An inductor is a passive electronic component that stores energy in the form of a magnetic field, and an inductor tends to resist any change in the amount of current flowing through it. The inductor is usually used with capacitors in various wireless communications applications for providing stable currents, switched phases, filtering and resonance. In its simplest form, the inductor consists of a wire loop or coil. The inductance is directly proportional to the number of turns, the thickness, the length, and the radius of the coil. The inductance also depends on the type of material around which the coil is wound. In a semiconductor manufacturing process, at least two metal layers with specifically designed layout patterns and a plurality of via plugs for connecting these two metal layers are used to form a wire loop, thus fabricating an inductor onto an integrated circuit chip. Recently, for obtaining an inductor with a smaller size, a three-dimensional inductor is produced to have an increased coil density.

Please refer to FIG. 1 showing a conventional schematic diagram of two-level spiral inductor 10. For saving chip area, as shown in FIG. 1, the inductor 10 is designed as two layered coils. The inductor 10 has two ends P1 and P2 and spirally circles a point C starting at the outer end P1 from an outer ring to an inner ring for a desired number of loops, which is then connected to another layer by a via plug, and spirals from an inner ring to an outer ring finally connecting to the end P2. It deserves to be mentioned that current flowing in the two layered coils is in the same direction which increases the mutual inductance of the inductor 10, that is, the current flows into the end P1 from the outer ring to the inner ring in a clockwise direction then connects to the second layer by the via plug, and similarly flows clockwise from the inner ring to the outer ring to the end P2.

Please refer to FIG. 2 showing a turn with essential components in a three-dimensional inductor manufactured using a conventional semiconductor technology disclosed in U.S. Pat. No. 6,037,649. The three-dimensional inductor 20 is made on a substrate 21 and comprises an N-turn coil. Each turn comprises a first-level metal line (M1) having a first end and a second end, a second-level metal line (M2) having a first part and a second part, and a third-level metal line (M3) having a first end and a second end which are isolated through the first, the second, and the third isolating layers. The adjacent levels of metal lines may be connected through the via plugs (24 and 27) in the isolating layers. The integral coil of the three-dimensional inductor is accomplished and extends along the direction of the magnetic field of the three-dimension inductor by connecting the second-level metal line (M2) in the Nth turn with the third-level metal line (M3) in the (N+1)th turn coil.

The inductor structures described above include only one inductor structure in the entire structure space. Therefore, the research and development to improve the integration level for an inductor structure is still needed.

SUMMARY OF THE INVENTION

An object of the present invention is to provide a three-dimensional inductor structure in which three independent inductors are integrated into a same space to achieve an excellent integration level.

Another object of the present invention is to provide an inductor structure in which two independent inductors are integrated into a same space to achieve an excellent integration level.

The three-dimensional inductor structure according to the present invention comprises a substrate; a plurality of insulation layers on the substrate; a first spiral conductive coil disposed in the insulation layer to form an inductor generating a magnetic field in a first direction; a second spiral conductive coil disposed in the insulation layer to form an inductor generating a magnetic field in a second direction; and a third spiral conductive coil disposed in the insulation layer to form an inductor generating a magnetic field in a third direction.

The inductor structure according to the present invention comprises a substrate; a plurality of insulation layers on the substrate; a first spiral conductive coil disposed in the insulation layer to form an inductor generating a magnetic field in a first direction; and a second spiral conductive coil disposed in the insulation layer to form an inductor generating a magnetic field in a second direction, wherein the first direction and the second direction are not parallel.

In the inductor structure according to the present invention, two, three, or more coils are disposed respectively in a same space in different directions to give the inductor structure a relatively high integration level. Therefore, only a relatively small space is needed to obtain a desired inductance.

These and other objectives of the present invention will no doubt become obvious to those of ordinary skill in the art after reading the following detailed description of the preferred embodiment that is illustrated in the various figures and drawings.

DETAILED DESCRIPTION

The three-dimensional inductor structure according to the present invention comprises three coils disposed in a plurality of insulation layers in a 3-D space. Each coil comprises a plurality of turns in a spiral type to form an inductor having a magnetic field with a direction. The three coils can be placed such that the conductive lines are in crossover positions.

Figure 1:
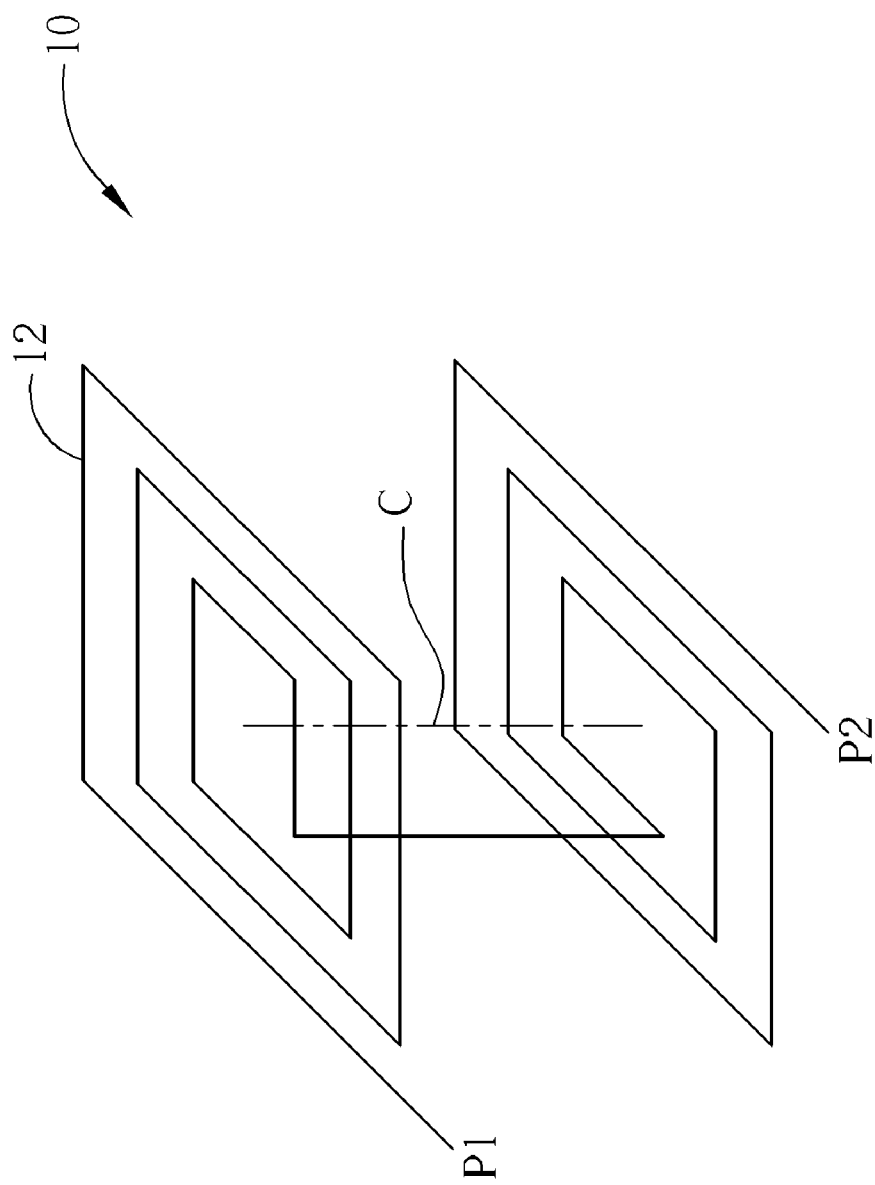
FIG. 1 shows a schematic diagram of a conventional two-level spiral inductor.
Figure 2:
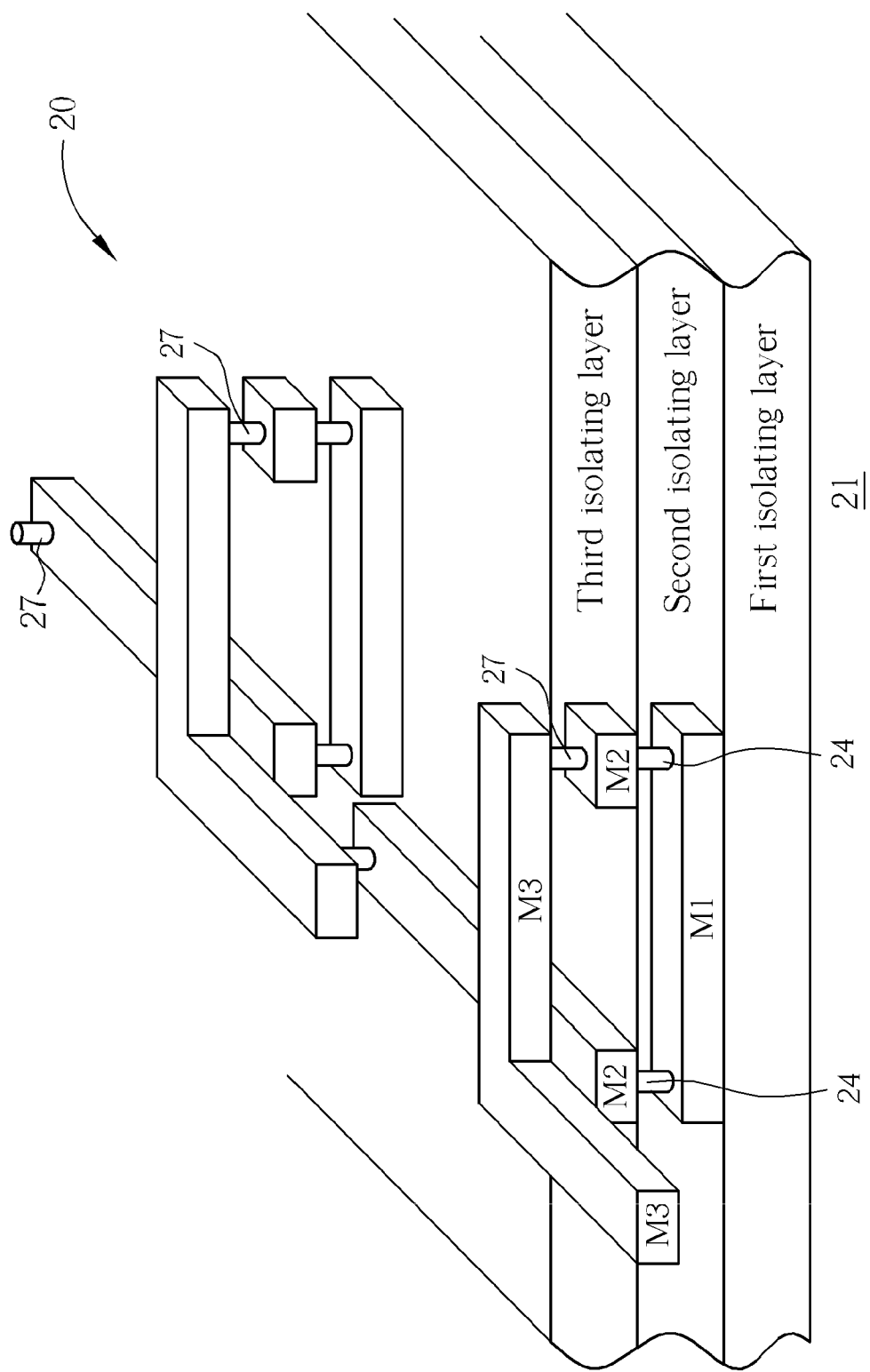
FIG. 2 shows a schematic diagram of a turn with necessary components in a conventional three-dimensional inductor coil.
Figure 3:
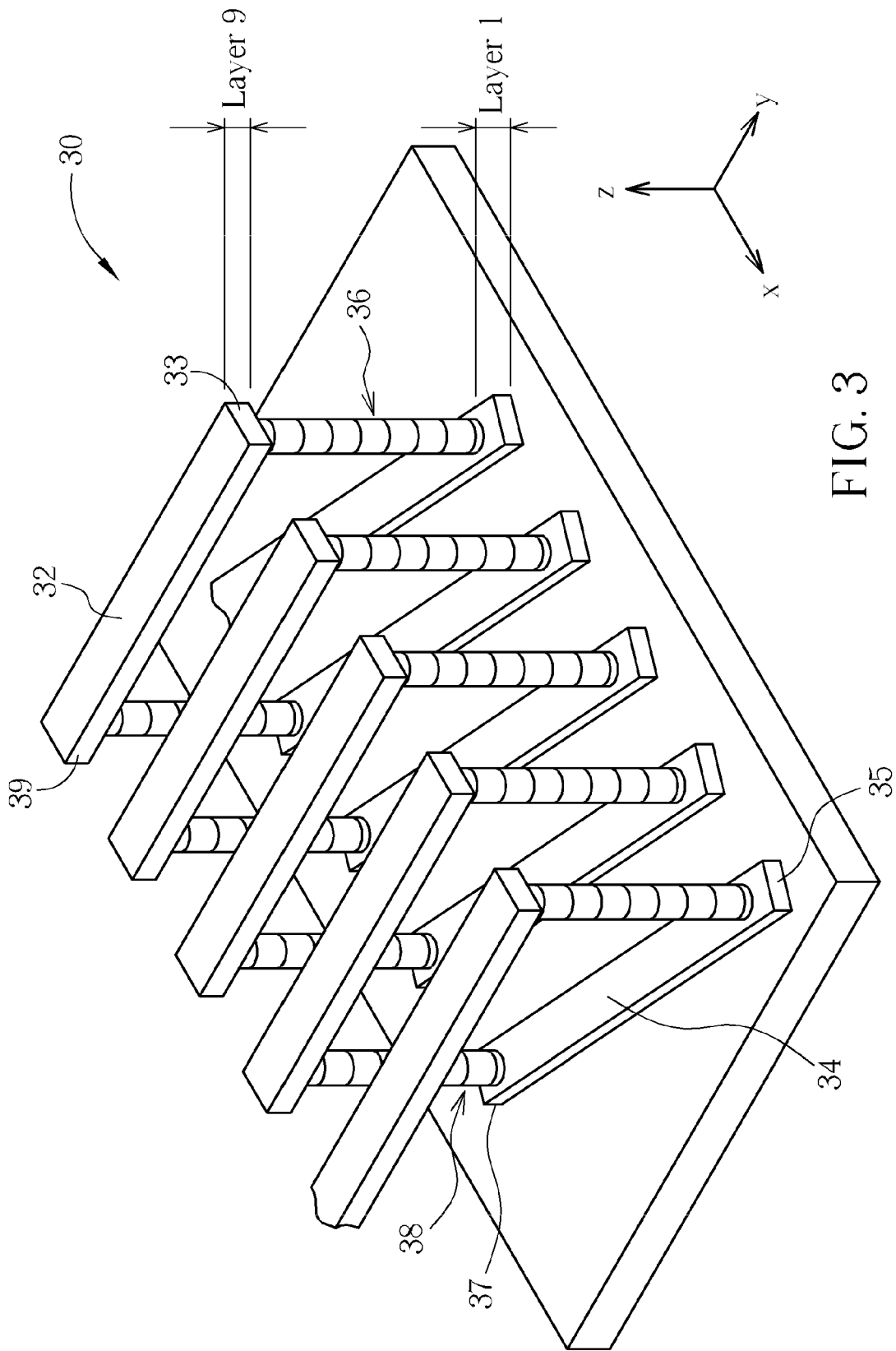
FIGS. 3 to 5 show respectively a schematic diagram of one of three coils in a three-dimensional inductor structure of an embodiment according to the present invention.
Figure 4:
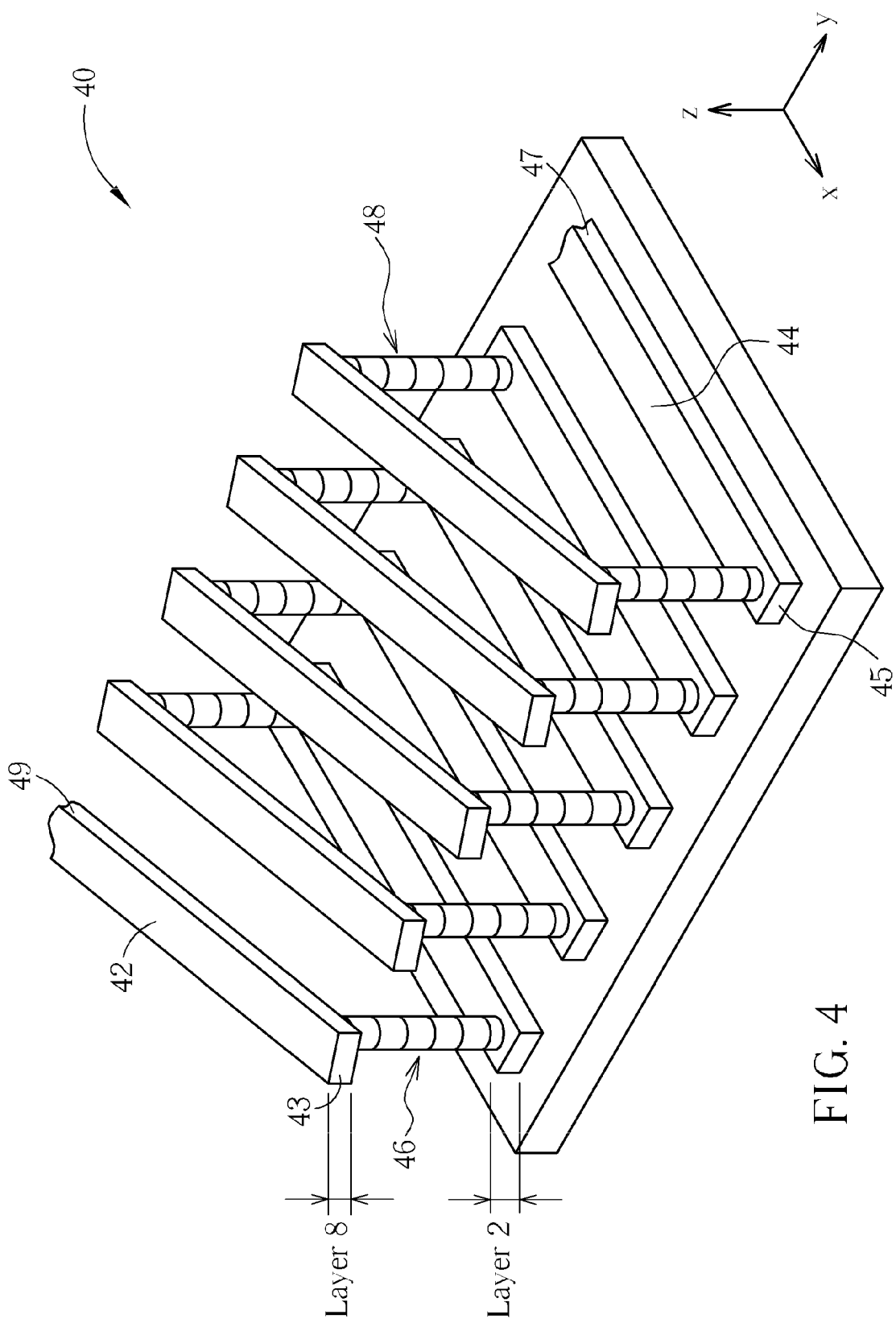
Figure 5:
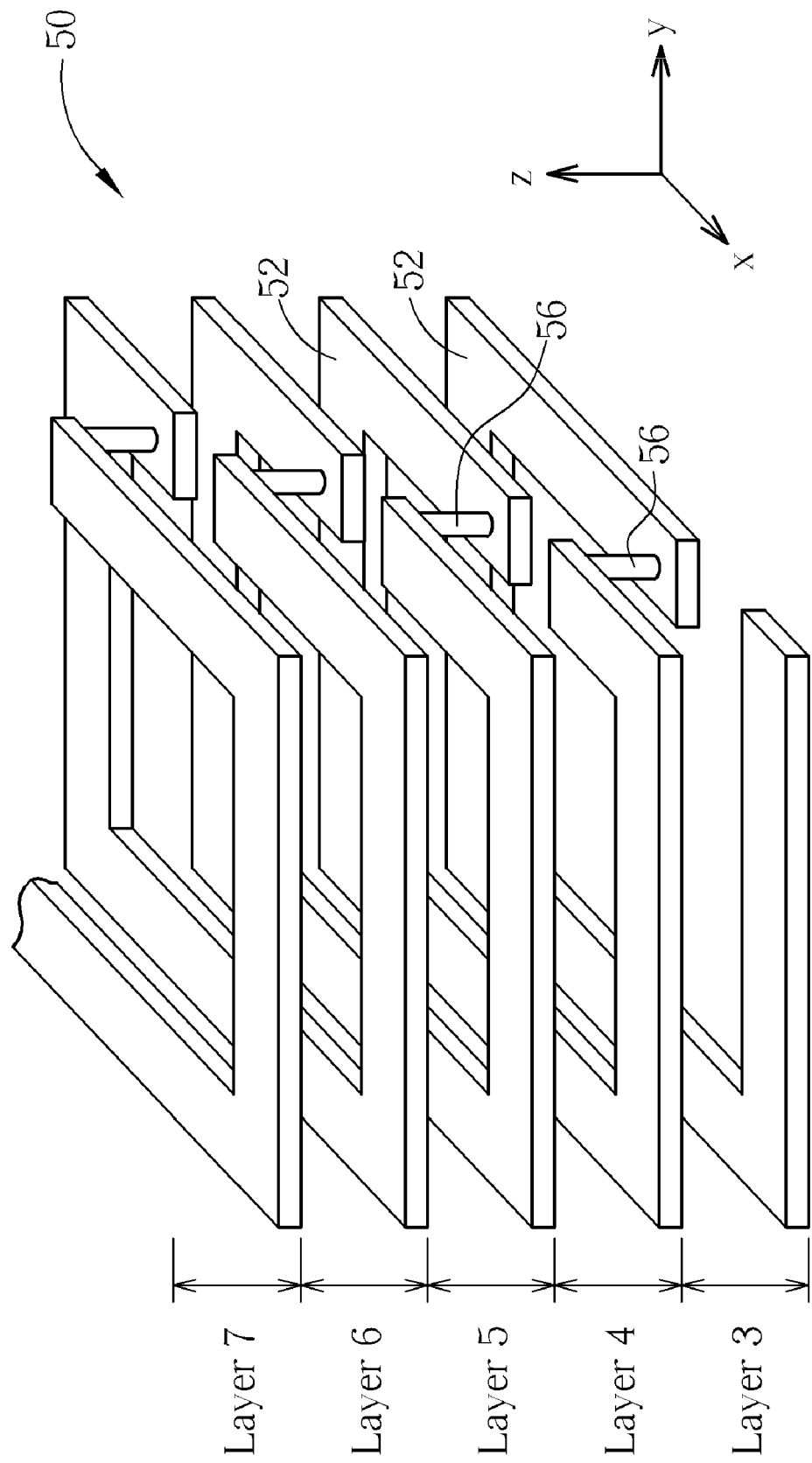

Alternatively, the three coils can be disposed in the three separated parts of the space. Please refer to FIGS. 3 to 5 showing an embodiment of the three-dimensional inductor structure according to the present invention. Only one coil is shown in the drawing for a purpose of illustration. Three coils are substantially constructed on a substrate in a same space.

Refer to FIG. 3 showing a coil of the three-dimensional inductor structure according to the present invention. The coil is a first spiral conductive coil 30 disposed in, for example, nine insulation layers. The first spiral conductive coil 30 comprises a plurality of turns, and each turn comprises four conductive sections. The first conductive section 32 is disposed on the ninth layer, being the top layer, of the nine insulation layers. The second conductive section 34 is disposed in the first layer, being the bottom layer, of the nine insulation layers. The two conductive sections 32 and 34 are electrically connected through the third conductive section 36. The third conductive section 36 is formed by connecting a via plug in each insulation layer between the first and the ninth insulation layers. The third conductive section 36 connects the first end 33 of the first conductive section 32 and a first end 35 of the second conductive section 34. The fourth conductive section 38 is formed by connecting another via plug in each insulation layer between the first and the ninth insulation layers. The fourth conductive section 38 connects the second end 37 of the second conductive section 34 and the second end 39 of the first conductive section 32 of an adjacent another turn. A turn is thus formed in such a way, and the same turn structure is duplicated to form a number of turns in the insulation layers to obtain a spiral coil disposed in the nine insulation layers. When an electric current flows through the coil, an induced magnetic field occurs in the direction of x coordinate.

Refer to FIG. 4 showing another coil of the three-dimensional inductor structure according to the present invention. The coil is a second spiral conductive coil 40 disposed in, for example, seven insulation layers in the middle part of the nine insulation layers mentioned above, that is, the second to the eighth layers. The first spiral conductive coil 40 comprises a plurality of turns, and each turn comprises four conductive sections. The fifth conductive section 42 is disposed in the eighth layer of the nine insulation layers. The sixth conductive section 44 is disposed in the second layer of the nine insulation layers. The two conductive sections 42 and 44 are electrically connected through the seventh conductive section 46. The seventh conductive section 46 is formed by connecting a via plug in each insulation layer between the second and the eighth insulation layers, to connect the first end 43 of the fifth conductive section 42 and a first end 45 of the six conductive section 44. The eighth conductive section 48 is formed by connecting another via plug in each insulation layer between the second and the eighth insulation layers to connect the second end 47 of the sixth conductive section 44 and the second end 49 of the fifth conductive section 42 of an adjacent another turn. A turn is thus formed in such a way, and the same turn structure is duplicated to form a number of turns in the insulation layers to obtain a spiral coil disposed in the seven insulation layers. When an electric current flows through the coil, an induced magnetic field occurs in the direction of y coordinate. In such structure, some conductive sections of the second spiral conductive coil 40 and some conductive sections of the first spiral conductive coil use same insulation layers but are crossover each other since the conductive sections are located in different parts of the same insulation layers.

Refer to FIG. 5 showing still another coil of the three-dimensional inductor structure according to the present invention. The coil is a third spiral conductive coil 50 disposed in, for example, five insulation layers in the middle part of the nine insulation layers mentioned above, that is, the third to the seven layers. The first spiral conductive coil 50 comprises a plurality of turns. One turn 52 or a plurality of turns in a flat spiral type are disposed in one of the insulation layers. The turns in the adjacent insulation layers connect to each other through a via plug 56 in the insulation layer. A turn is thus formed in such a way, and the same turn structure is duplicated to form a number of turns in the insulation layers to obtain a spiral coil disposed in the five insulation layers of the nine insulation layers. When an electric current flows through the coil, an induced magnetic field occurs in the direction of z coordinate. In such structure, some conductive sections of the third spiral conductive coil 50 and some conductive sections of the first or the second spiral conductive coil use same insulation layers but are crossover each other since the conductive sections are located in different parts of the same insulation layers.

Figure 6:
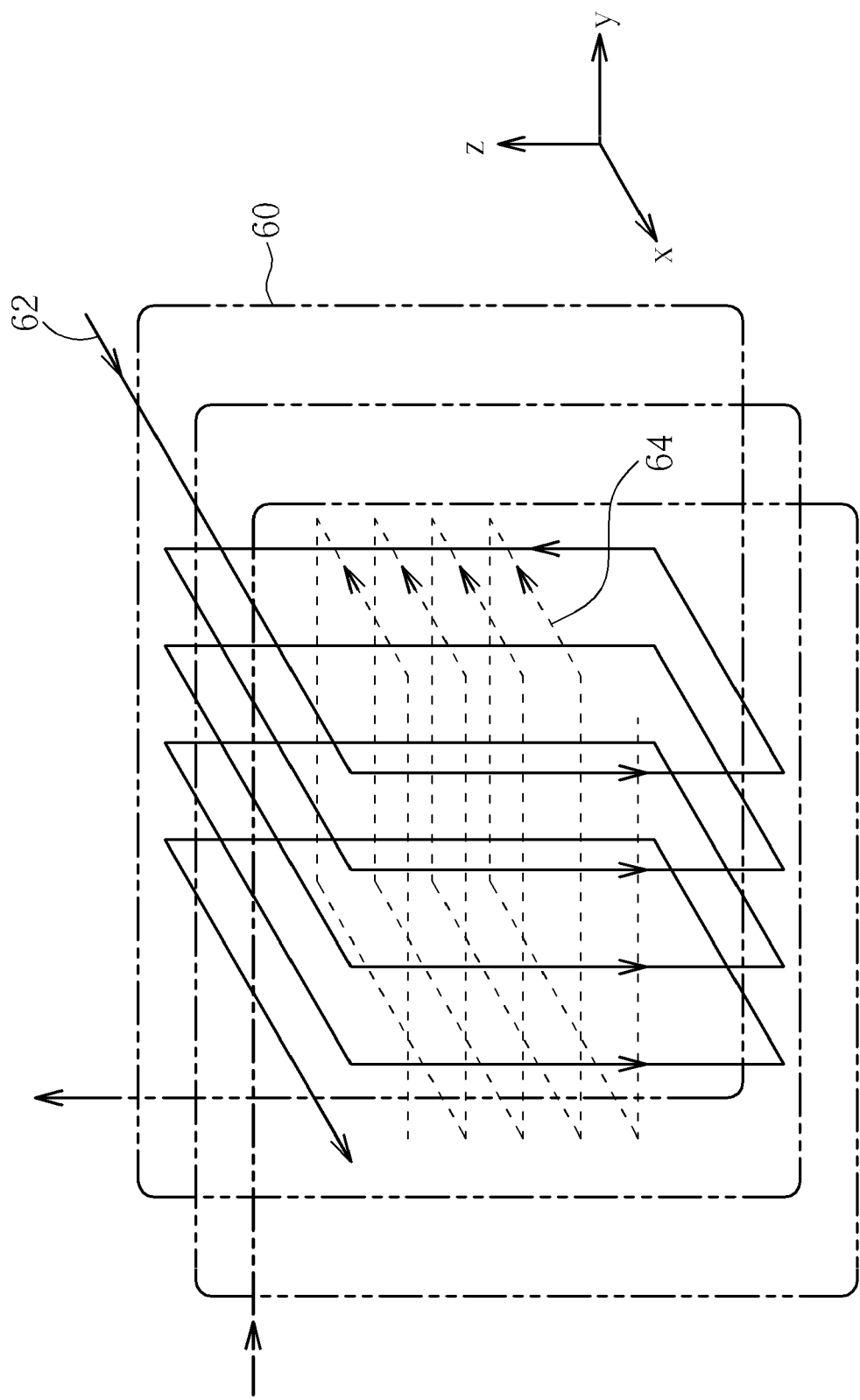
FIG. 6 shows a schematic diagram of a three-dimensional inductor structure of an embodiment according to the present invention.

The three-dimensional inductor structure obtained as described above may be shown as the schematic diagram in FIG. 6. The coils 60, 62, and 64 are disposed in a same 3-D space and cross over to each other. The arrows show some examples of flow direction for electric current in FIG. 6. When two inductors are formed from coils each having a magnetic field with a direction perpendicular to each other, interference will not occur between the two inductors. The three-dimensional inductor structure according to the present invention may have many embodiments. For example, the coil 60 may be disposed in the first layer to the ninth layer of the insulation layer, and the coil 62 may be disposed in the second layer to the eighth layer of the insulation layers. One or more insulation layers may be further formed between the first layer and the second layer or between the ninth layer and the eighth layer. Alternatively, the coil 62 may be disposed in the first layer to the ninth layer of the insulation layer, and the coil 60 may be disposed in the second layer to the eighth layer of the insulation layers. One or more insulation layers may be further formed between the first layer and the second layer or between the ninth layer and the eighth layer. The coil 64 may be disposed in the third layer to the seventh layer of the insulation layers. The coil 64 may be disposed in more or less than five insulation layers, even only in one layer, and thus the entire structure may only have five layers. When the coil 64 is disposed in only one insulation layer, it may be formed in a flat spiral shape. Alternatively, the coil 64 is disposed in more than five insulation layers and the entire structure has more than nine insulation layers. Alternatively, two adjacent turns of the coil 64 may have an interval with several insulation layers, and the coils 60 and 62 are disposed in the several insulation layers. Therefore, the three-dimensional inductor structure according to the present invention may have a structure of only five or more insulation layers without limit, depending on desired designs.

Alternatively, in another aspect according to the present invention, the inductor structure may comprise two coils having structures as two of the coils 60, 62, and 64, for example, coils 60 and 62, coils 60 and 64, or coils 60 and 64, occupying a same space. The current directions of the coils may be in a variety of combinations.

Figure 7:
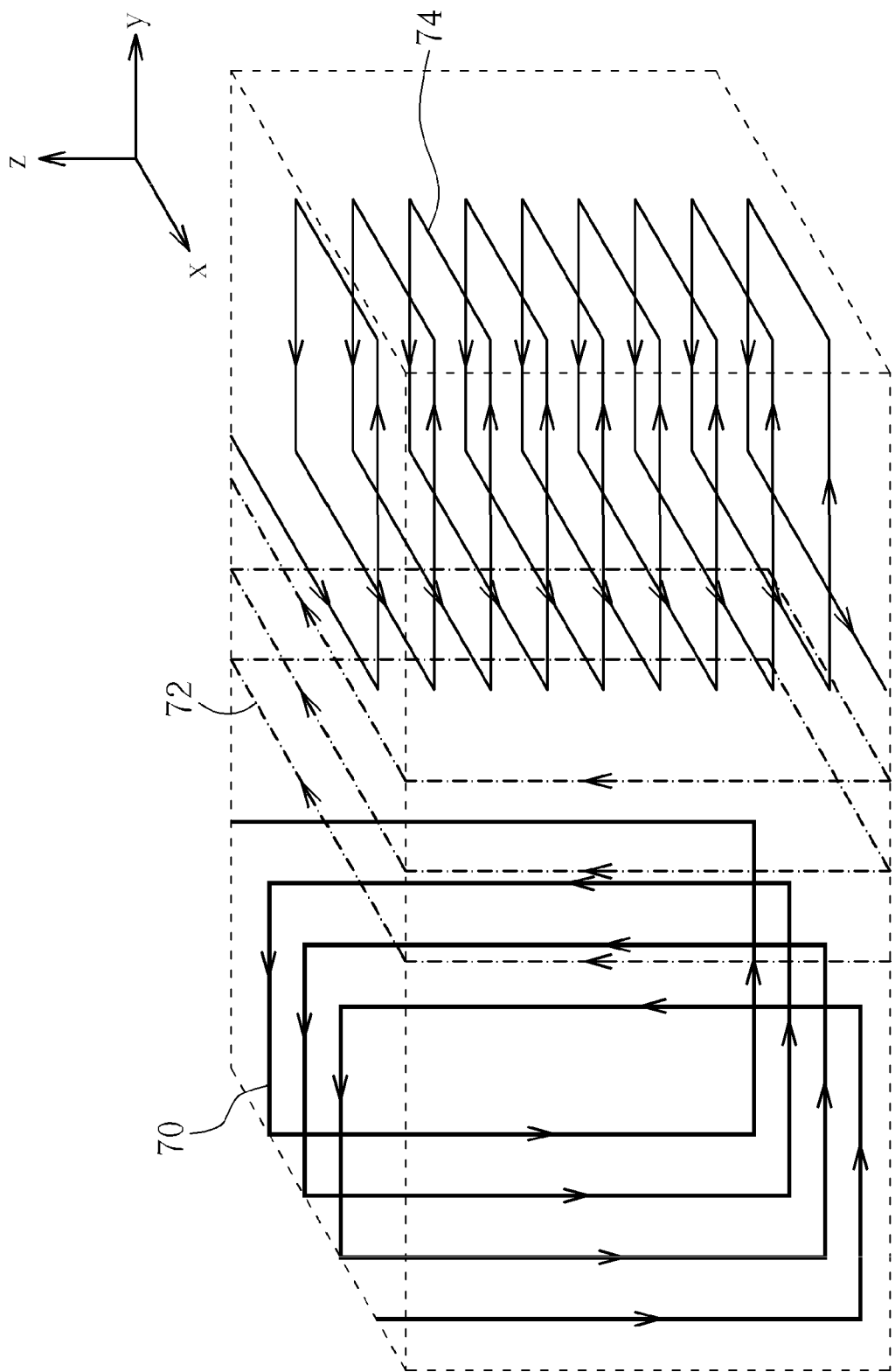
FIGS. 7 to 15 show schematic diagrams of inductor structures of some embodiments according to the present invention.
Figure 11:
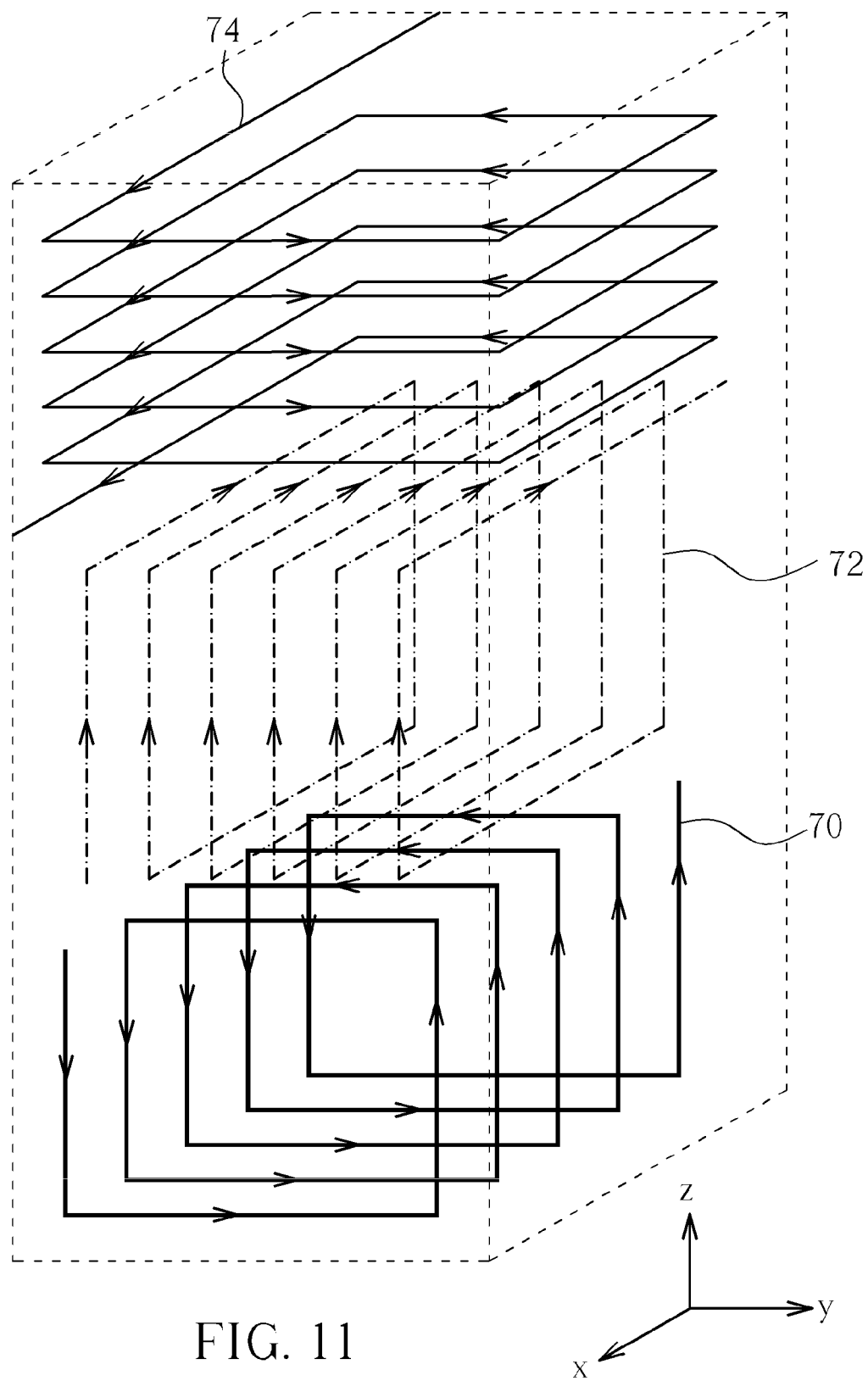

The spiral coils described above are disposed in a same space, together using the insulation layers and crossing over to each other. The coils may be also disposed in different parts of the 3D-space, that is, the three coils do not occupy the insulation layers in common, as shown in FIG. 7 showing a schematic diagram of another embodiment of the three-dimensional inductor structure according to the present invention. The coil 70 is disposed in the first part of the insulation layers as described for the first spiral conductive coil 30, provided that the coil 70 is singly disposed in this part of the nine insulation layers. When an electric current flows through the coil, an induced magnetic field occurs in the direction of x coordinate. The coil 72 is disposed in the second part of the insulation layers as described for the second spiral conductive coil 40, provided that the coil 72 is singly disposed in this part of the nine insulation layers. When an electric current flows through the coil, an induced magnetic field occurs in the direction of y coordinate. The coil 74 is disposed in the third part of the insulation layers as described for the third spiral conductive coil 50, provided that the coil 74 is singly disposed in this part of the nine insulation layers. When an electric current flows through the coil, an induced magnetic field occurs in the direction of z coordinate. The relative positions and the current directions for the coils 70, 72, and 74 in the three-dimensional inductor structure according to the present invention, as shown in FIG. 7, may have other combinations, such as, the coil 70 between the coil 72 and the coil 74, the coil 74 between the coil 70 and the coil 72, and the like. Alternatively, as shown in FIG. 11, the coils 70, 72, and 74 may be in a vertical arrangement in the insulation layers. The relative positions and current directions may be in other combinations, for example, the coil 70 between the coil 72 and the coil 74, the coil 74 between the coil 70 and the coil 72, and the like.

Figure 15:
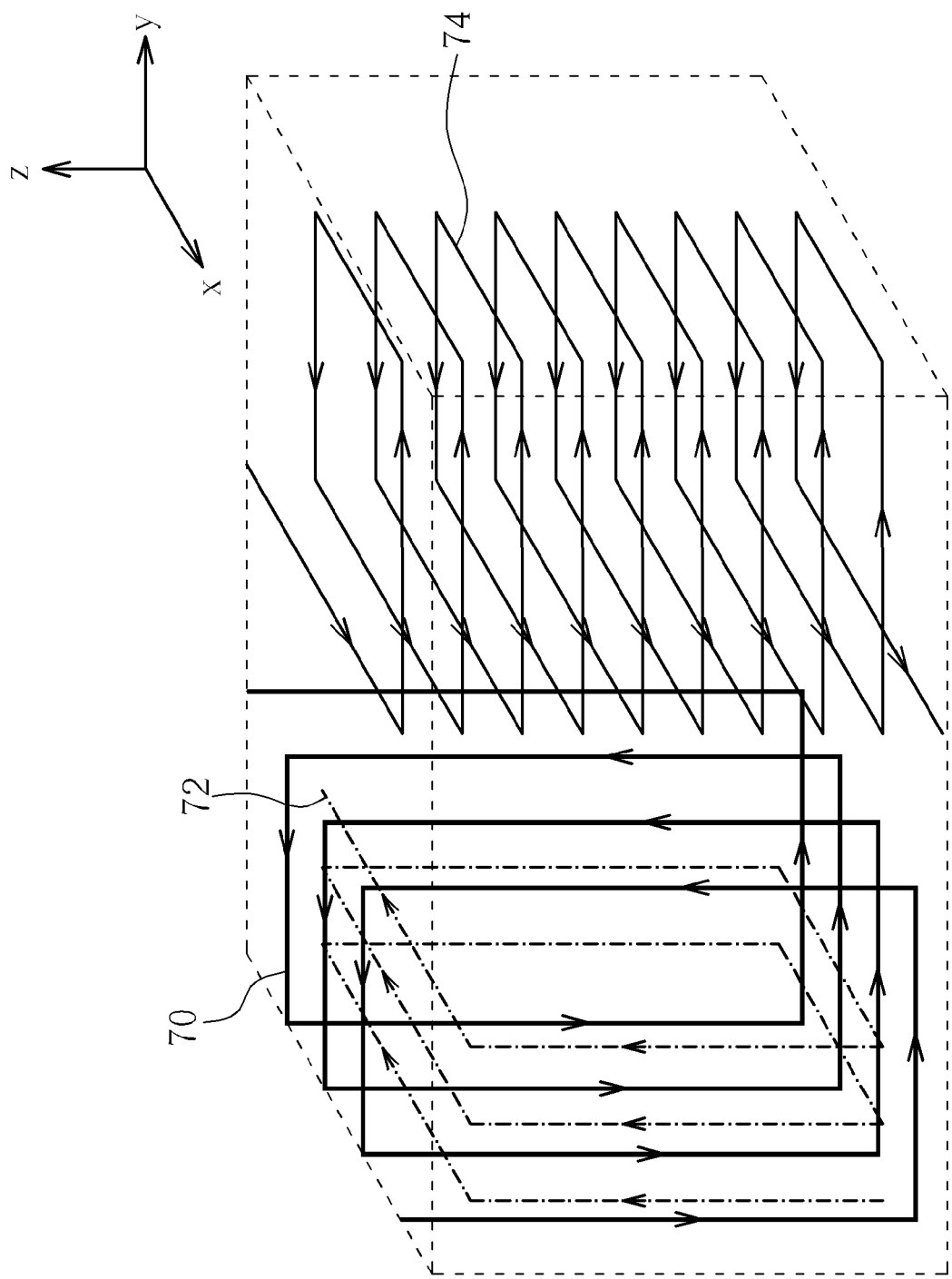

The three-dimensional inductor structure according to the present invention disposed in one space may comprise one coil separately disposed in one part of the space and another two coils disposed together and crossing over to each other in another part of the space. For example, a first coil and a second coil together use a part of the nine insulation layers, and a third coil singly uses the rest of the nine insulation layers. Alternatively, a first coil and a third coil together use a part of the nine insulation layers, and the other coil singly uses the rest of the nine insulation layers. As shown in FIG. 15, the coils 70 and 72 together use a part of the insulation layers, and the coil 74 uses another part of the insulation layers.

Figure 8:
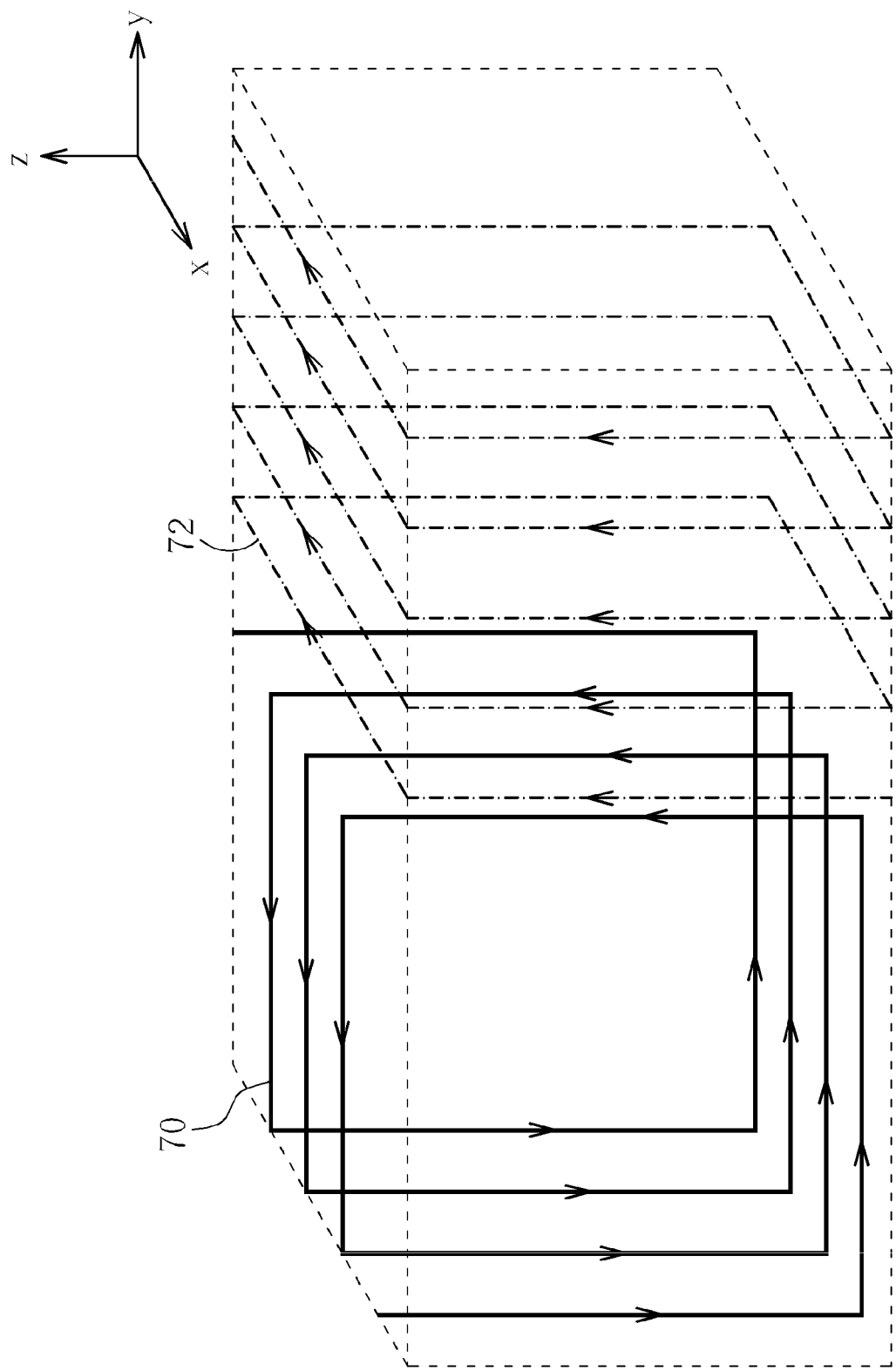
Figure 9:
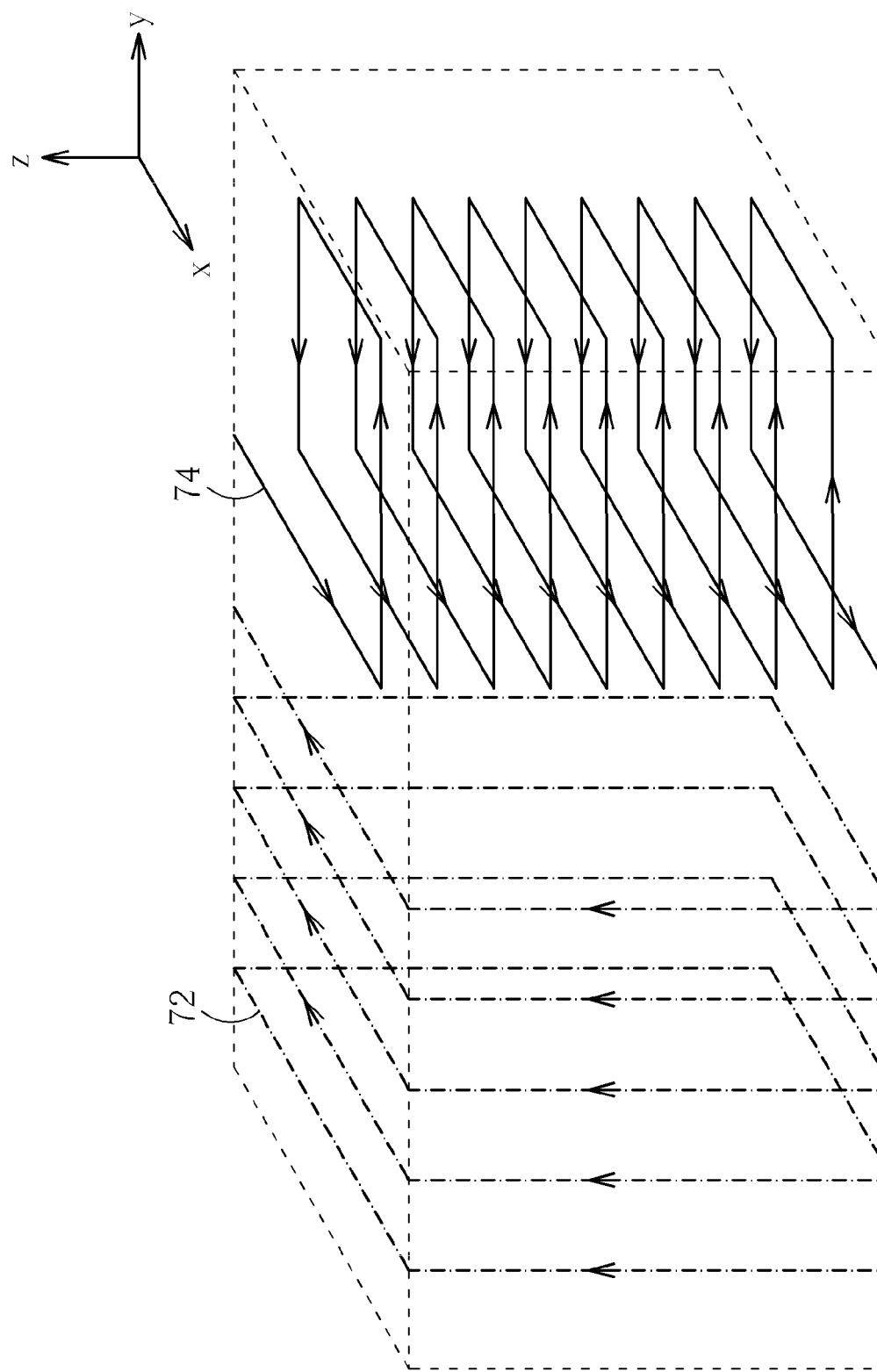
Figure 10:
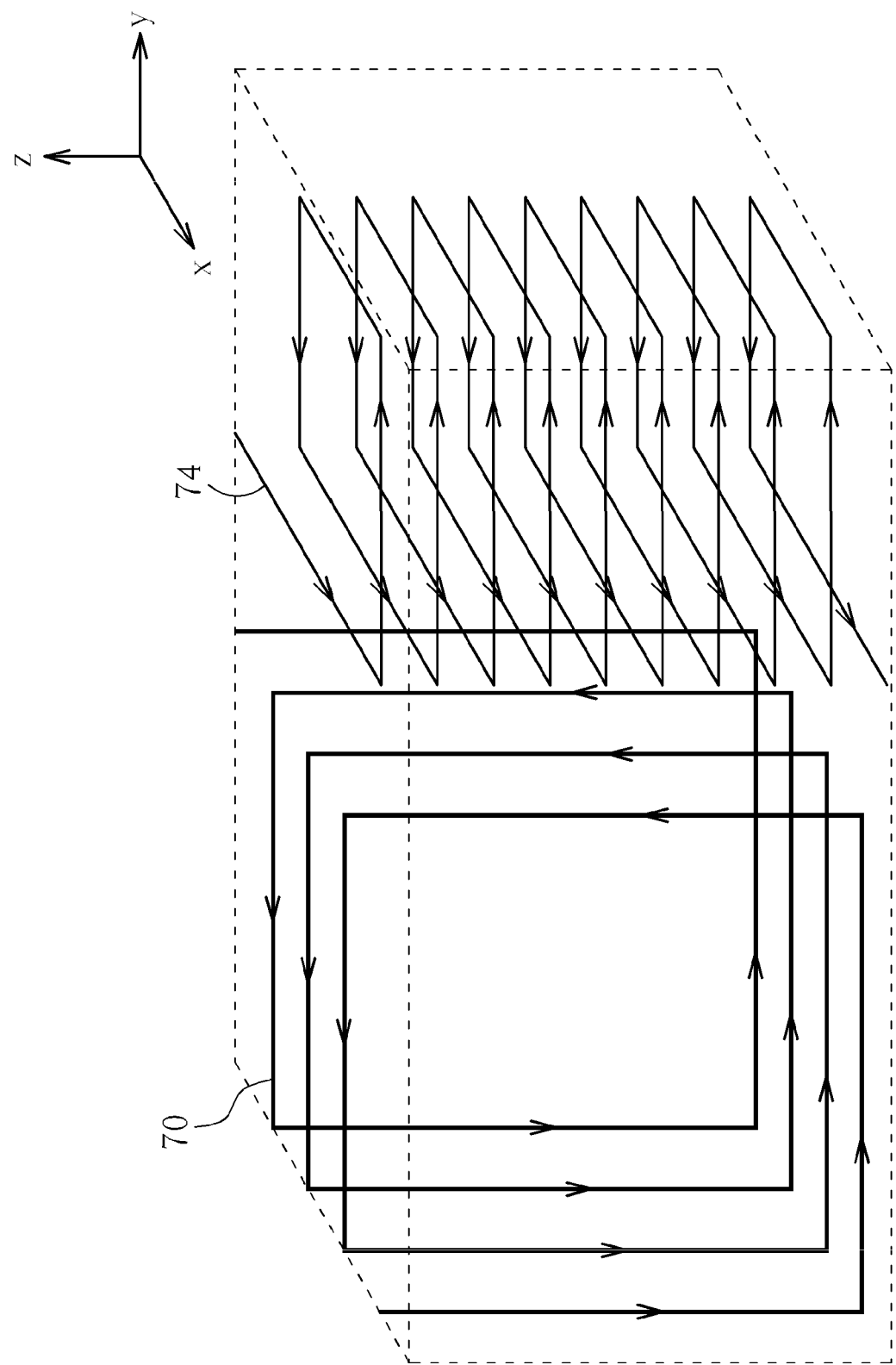
Figure 12:
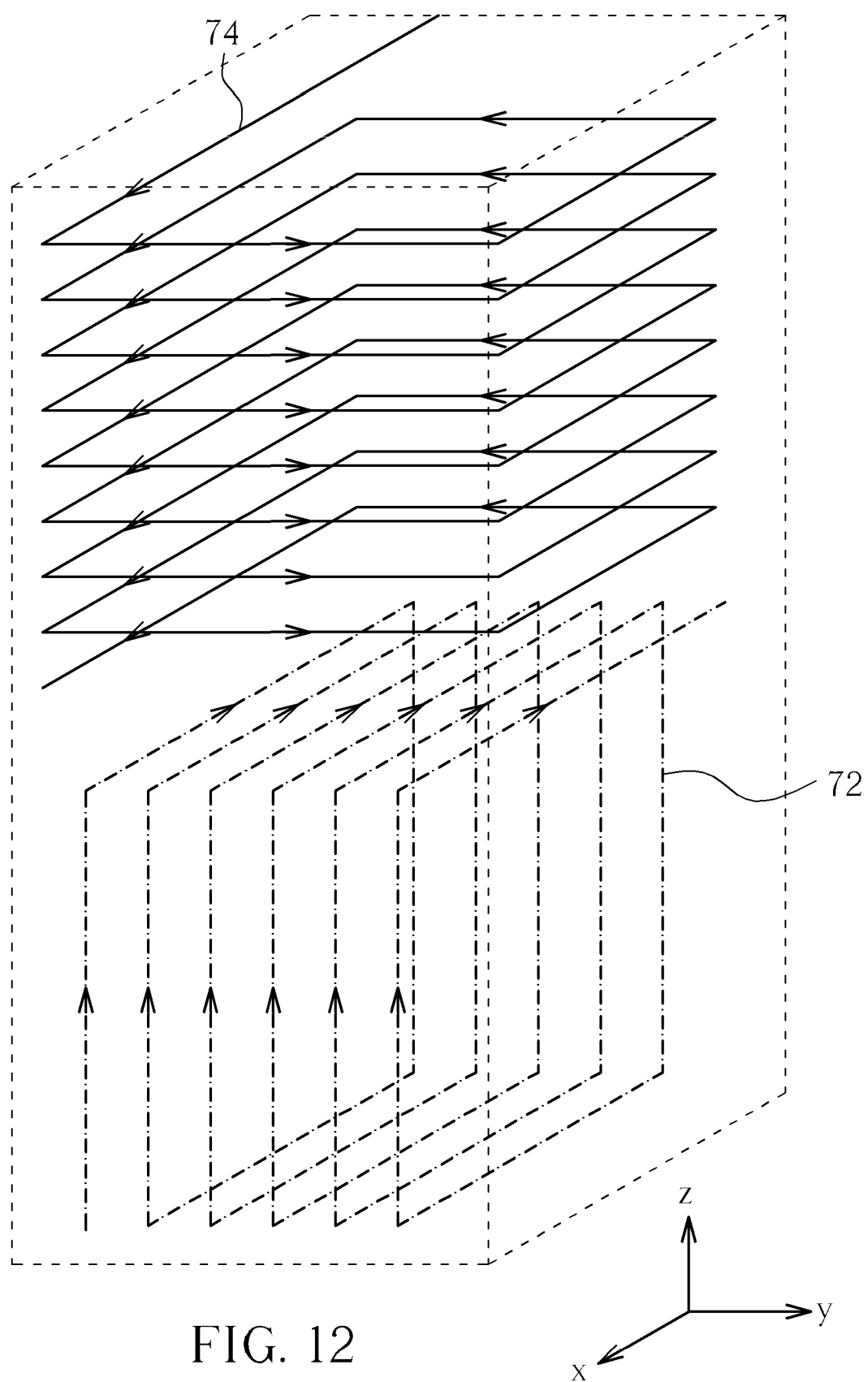
Figure 13:
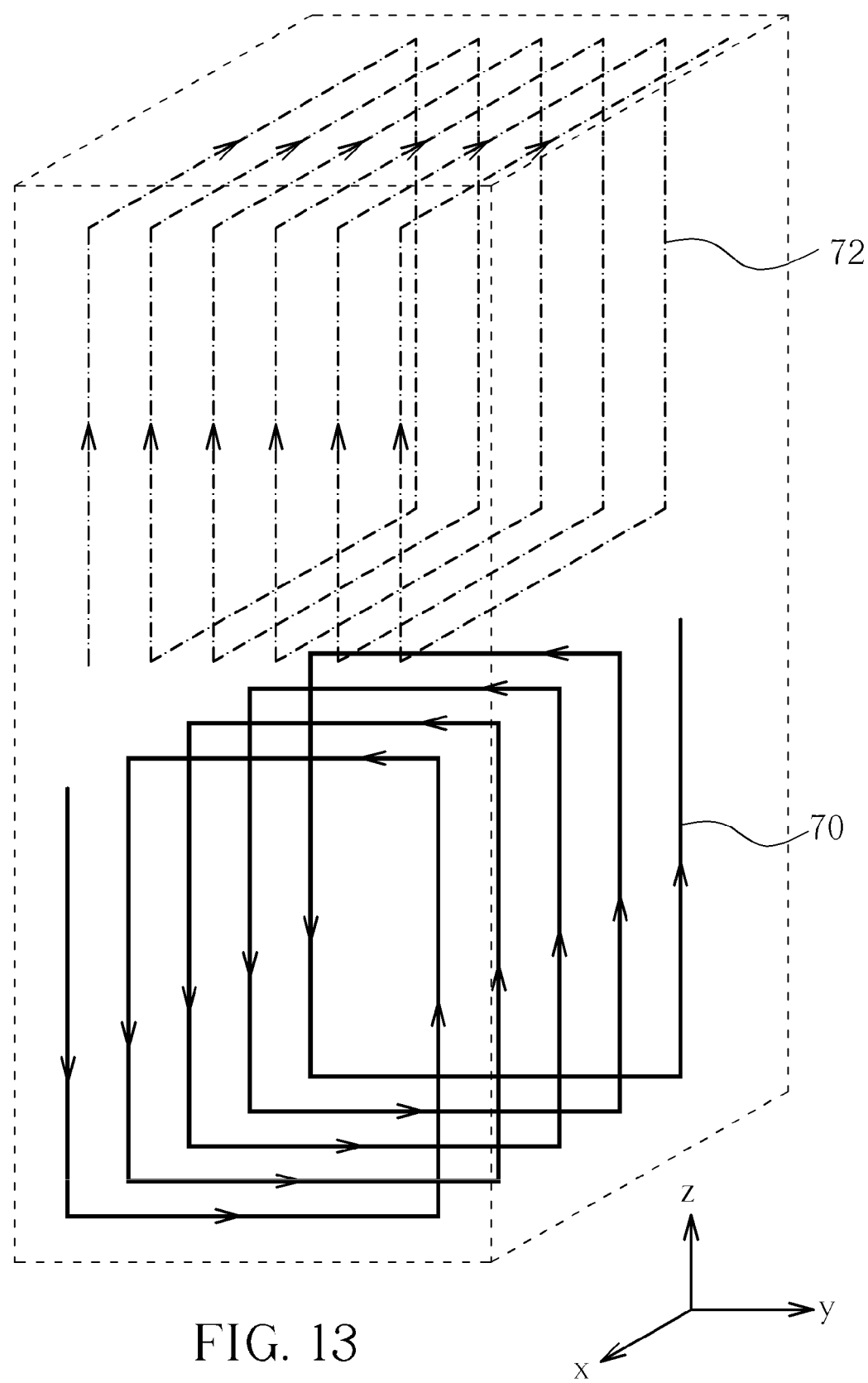
Figure 14:
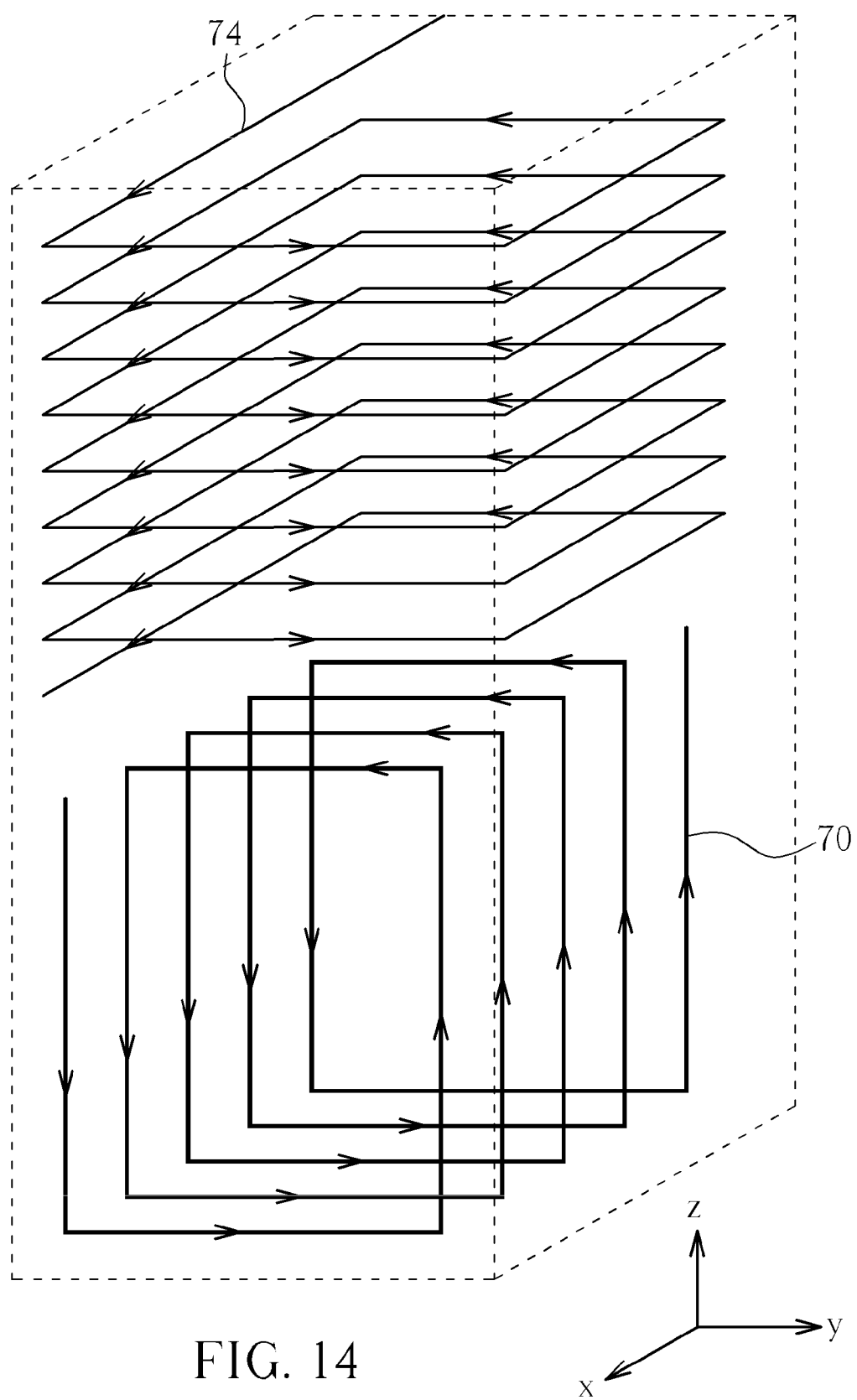

Alternatively, in another aspect according to the present invention, the inductor structure may comprise two coils having structures as two of the coils 70, 72, and 74, for example, the coils 70 and 72, the coils 72 and 74, or the coils 70 and 74, occupying different parts of the insulation layers. The current directions of the coils may be in a variety of combinations, and the directions of the magnetic fields produced from the two coils are not parallel from each other. FIGS. 8 to 10 each show the inductor structure comprising the coils 70 and 72, the coils 72 and 74, and the coils 70 and 74, respectively, in a lateral arrangement in the insulation layers. FIGS. 12 to 14 each show the inductor structure comprising the coils 74 and 72, the coils 72 and 70, and the coils 74 and 70, respectively, in a vertical arrangement, occupying different insulation layers.

The three-dimensional inductor structure according to the present invention may be disposed on the substrate, such as a semiconductor substrate or silicon substrate, and manufactured by semiconductor manufacturing processes, such as deposition, etching, chemically mechanical planarization, copper damascene, and metal via plug process. The insulation layer may comprise electrically insulation material, such as silicon dioxide ($SiO_2$), silicon nitride ($Si_3N_4$), phosphosilicate glass (PSG), or borophosphosilicate glass (BPSG). The conductive sections and via plugs may comprise electrically conductive material, such as metal. The metal may be for example copper or copper-aluminum alloy. The shape of each coil including conductive sections and via plugs and the positions for via plug connection are not specially limited and can be designed as desired.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An inductor structure, comprising:
   a substrate;
   a plurality of insulation layers on the substrate;
   a first spiral conductive coil disposed in the insulation layers to form an inductor generating a magnetic field in a first direction; and
   a second spiral conductive coil disposed in the insulation layers to form an inductor generating a magnetic field in a second direction;
   wherein the first direction and the second direction are not parallel to each other, and a conductive section of the first spiral conductive coil and a conductive section of the second spiral conductive coil are disposed in a same one of the insulation layers and cross over to each other.

2. The inductor structure as claimed in claim, wherein the first spiral conductive coil has a plurality of first turns and each of the first turns comprises:
   a first conductive section in a first insulation layer of the insulation layers;
   a second conductive section in a second insulation layer of the insulation layers;
   a third conductive section comprising a first group of via plugs formed in the insulation layers to connect a first end of the first conductive section and a first end of the second conductive section; and
   a fourth conductive section comprising a second group of via plugs formed in the insulation layers to connect a second end of the second conductive section and a second end of the first conductive section of an adjacent another first turn.

3. The inductor structure as claimed in claim 2, wherein the second spiral conductive coil has a plurality of second turns and each of the second turns comprises:
   a fifth conductive section in a third insulation layer under the first insulation layer;
   a sixth conductive section in a fourth insulation layer above the second insulation layer;
   a seventh conductive section comprising a third group of via plugs formed in the insulation layers to connect a first end of the fifth conductive section and a first end of the sixth conductive section; and
   an eighth conductive section comprising a fourth group of via plugs formed in the insulation layers to connect a second end of the sixth conductive section and a second end of the fifth conductive section of an adjacent another second turn.

4. The inductor structure as claimed in claim 2, wherein the second spiral conductive coil has a plurality of third turns each disposed in an insulation layer, respectively, under the first insulation layer and above the second insulation layer, and two adjacent third turns connect each other through a via plug in the insulation layer.

5. The inductor structure as claimed in claim 3, further comprising a third spiral conductive coil having a plurality of fourth turns each disposed in one of the insulation layers, respectively, beside, under, or above the first spiral conductive coil and the second spiral conductive coil, and two adjacent fourth turns connecting each other through a via plug in the insulation layer.

6. The inductor structure as claimed in claim 4, further comprising a third spiral conductive coil disposed in the insulation layers beside, under, or above the first spiral conductive coil and the second spiral conductive coil, wherein the third spiral conductive coil has a plurality of fifth turns and each of the fifth turns comprises:
- a fifth conductive section in a third insulation layer being one of the insulation layers, either the third insulation layer being the first insulation layer or being not the first insulation layer;
- a sixth conductive section in a fourth insulation layer being another of the insulation layers, either the fourth insulation layer being the second insulation layer or being not the second insulation layer;
- a seventh conductive section comprising a third group of via plugs formed in the third insulation layer, the fourth insulation layer, and the insulation layers therebetween to connect a first end of the fifth conductive section and a first end of the sixth conductive section; and
- an eighth conductive section comprising a fourth group of via plugs formed in the third insulation layer, the fourth insulation layer, and the insulation layers therebetween to connect a second end of the sixth conductive section and a second end of the fifth conductive section of an adjacent another second turn.

7. The inductor structure as claimed in claim 1, wherein the first direction is perpendicular to the second direction.

8. The inductor structure as claimed in claim 1, further comprising a third spiral conductive coil disposed in the insulation layers to form an inductor generating a magnetic field in a third direction, wherein the third spiral conductive coil is disposed in the insulation layers beside, under, or above the first spiral conductive coil and the second spiral conductive coil.

* * * * *